United States Patent [19]

Blain

[11] Patent Number: 5,382,912

[45] Date of Patent: Jan. 17, 1995

[54] RESISTANCE MONITORS

[75] Inventor: David I. Blain, Cheltenham, England

[73] Assignee: Smiths Industries Public Limited Company, London, England

[21] Appl. No.: 108,939

[22] Filed: Aug. 19, 1993

Related U.S. Application Data

[63] Continuation of Ser. No. 949,976, Sep. 24, 1992, abandoned.

Foreign Application Priority Data

[30]

Oct. 10, 1991 [GB] United Kingdom ............... 9121506

[51] Int. Cl.⁶ .................. G01K 27/02; B60R 21/32; B60Q 1/00
[52] U.S. Cl. .................. 324/713; 280/735; 340/438
[58] Field of Search ........... 324/715, 713, 502; 307/10.1; 340/436, 438; 73/118.1; 280/734, 735; 180/271

[56] References Cited

U.S. PATENT DOCUMENTS

| | | | |
|---|---|---|---|
| 2,744,236 | 5/1956 | Scarborough | 324/502 |
| 3,641,430 | 2/1972 | Williams | 324/502 |
| 4,020,416 | 4/1977 | Ottos | 324/715 |
| 4,667,149 | 5/1987 | Cohen et al. | 324/715 |
| 4,968,965 | 11/1990 | Naitou et al. | 280/735 |
| 4,990,884 | 2/1991 | McCurdy et al. | 340/438 |
| 5,018,763 | 5/1991 | Okano et al. | 340/438 |
| 5,038,134 | 8/1991 | Kondo | 340/438 |
| 5,053,744 | 10/1991 | Tozawa | 340/438 |
| 5,081,442 | 1/1992 | Ito et al. | 340/438 |
| 5,101,192 | 3/1992 | Ishizuka | 340/436 |
| 5,122,780 | 6/1992 | Midorikawa et al. | 280/735 |
| 5,136,275 | 8/1992 | Madua et al. | 340/438 |
| 5,140,276 | 8/1992 | Fisher | 324/713 |
| 5,155,376 | 10/1992 | Okano | 340/438 |
| 5,158,323 | 10/1992 | Yamamoto et al. | 340/438 |
| 5,166,880 | 11/1992 | Furui | 280/735 |
| 5,181,011 | 1/1993 | Okano | 280/734 |
| 5,268,643 | 12/1993 | Aso et al. | 324/502 |
| 5,293,153 | 3/1994 | Rochette et al. | 340/438 |

FOREIGN PATENT DOCUMENTS

| | | |
|---|---|---|
| 0174075 | 3/1986 | European Pat. Off. . |
| 0496254 | 7/1992 | European Pat. Off. . |
| 3326956 | 5/1984 | Germany ............ 324/713 |
| 3735900 | 5/1989 | Germany . |
| 1596498 | 8/1981 | United Kingdom . |
| 2157837 | 10/1985 | United Kingdom . |
| 2196131 | 4/1988 | United Kingdom . |

OTHER PUBLICATIONS

"Electrical Measurements and Measuring Instruments" by Golding, Published 1970, pp. 287, 298.

"Actuation with a Bang", by G. T. Batori, Machine Design, vol. 46, No. 31, pp. 49–53, Dec. 26, 1974.

*Primary Examiner*—Maura K. Regan
*Attorney, Agent, or Firm*—Pollock, VandeSande and Priddy

[57] ABSTRACT

An aircraft fire extinguisher system includes a fire extinguisher bottle and an attached explosive squib which has one side connected to ground and its other side connected alternately to two constant current sources in opposite senses. A differential amplifier subtracts the voltages in two sample-and-hold circuits caused by the opposite currents to eliminate the effect of the voltage at the point where the squib is grounded. A utilization circuit, coupled to the output of the differential amplifier, is used to indicate the presence of a fault in the squib or in associated circuitry.

5 Claims, 1 Drawing Sheet

RESISTANCE MONITORS

This application is a continuation of Ser. No. 07/949,976, filed on Sep. 24, 1992, now abandoned.

BACKGROUND OF THE INVENTION

The present invention relates to aircraft fire extinguisher systems, and is more particularly concerned with monitors for checking continuity in a resistive explosive squib in a fire extinguisher.

Aircraft fire extinguishers are discharged by supplying a large current to an explosive, resistive squib attached to the fire extinguisher bottle. Firing of the squib causes the extinguisher substance in the bottle to be released. Because the fire extinguisher system must be of high integrity, it is usual to test the continuity of the circuit including the squibs at the start of each flight leg. The conventional way of testing this continuity is to supply to the circuit a low current insufficient to fire the squib or cause deterioration. If the current flows to ground, there is assumed to be continuity through the squib to ground. This test, however, is unable to distinguish between a correctly operating fire extinguisher circuit and one where the circuit is shorted to ground before the squib. Furthermore, the conventional way of testing is not able to identify a squib which is out of tolerance unless this is excessive.

One way of overcoming these difficulties would be to measure the resistance of the squib. This, however, presents problems in that the potential of the ground point to which the squib is attached is unknown because it may be at some distance. The resistance could be measured if additional wiring were utilized but this is undesirable in aircraft applications because of the increased weight and complexity.

BRIEF SUMMARY OF THE DISCLOSURE

It is an object of the present invention to provide a resistance monitor can be used to avoid these problems.

According to the present invention, there is provided a circuit for monitoring the resistance of a resistive element connected to a ground point and associated circuitry, the circuit including means for supplying a first current to the element in a first direction, means for measuring the first voltage across the element and associated circuitry caused by the first current, means for supplying a second current to the element in a second direction opposite from the first direction, means for measuring the second voltage across the element and associated circuitry caused by the second current, and means for calculating the resistance of the element from the first and second voltages.

The first and second currents are preferably equal. The means for supplying the first and second currents may be respective constant current sources or include a respective voltage supply and resistor connected in series. The circuit preferably includes first and second sample-and-hold circuits connected to receive the respective first and second voltages, and a differential amplifier having two inputs connected to respective ones of the sample-and-hold circuits.

According to another aspect of the invention there is provided a system including a resistive explosive squib connected at one side to ground and at its other side to associated circuitry, and a circuit for monitoring the resistance of the squib, the circuit including means for supplying a first current in a first direction to the squib insufficient to cause firing of the squib, means for measuring the first voltage across the squib and associated circuitry caused by the first current, means for supplying a second current to the squib in a second direction opposite from said first direction, the second current being insufficient to cause firing of the squib, means for measuring the second voltage across the squib and associated circuitry caused by the second current, and means for calculating the resistance of the squib from the first and second voltages.

The squib element may be a fire extinguisher squib.

A fire extinguisher system for an aircraft, in accordance with the present invention, will now be described, by way of example, with reference to the accompanying drawings.

DETAILED DESCRIPTION OF THE PREFERRED EMBODIMENTS

Figure 1:
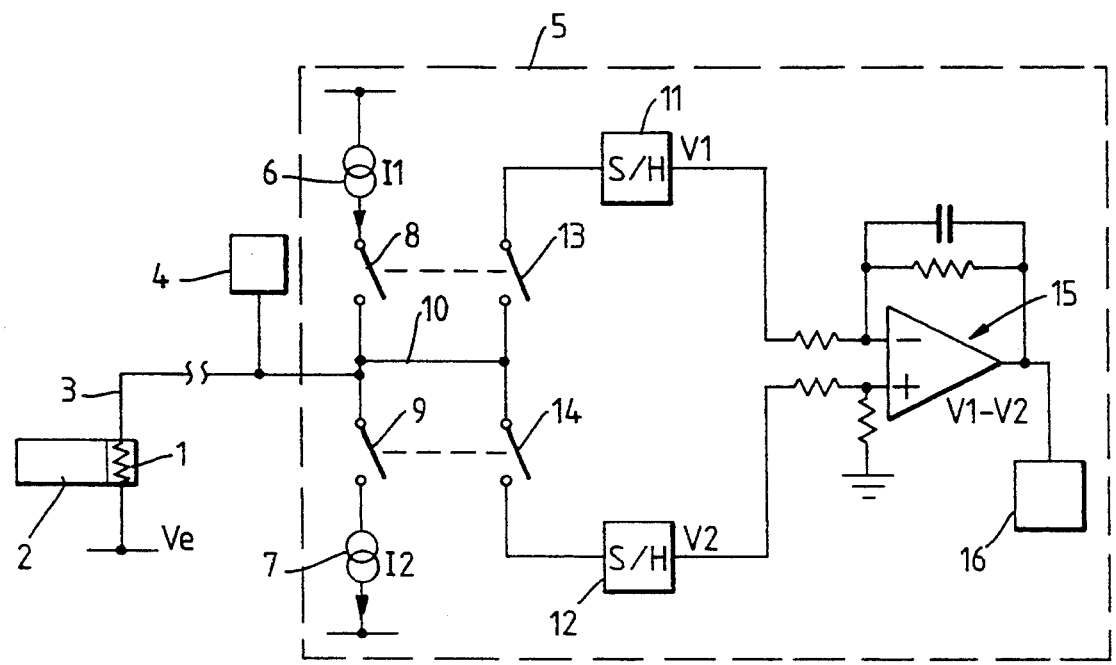
FIG. 1 is a schematic diagram of the system.

The rise extinguisher system includes an explosive squib 1, on a fire extinguisher bottle 2. The squib 1 is an electrical resistive element of resistance Rm one side of which is connected to local ground and the other side of which is connected to a firing cable 3. The firing cable 3 extends to a firing circuit 4, which is operable to supply a high current to the squib 1 sufficient to cause it to explode, and to a test circuit 5 which also forms a part of the system.

The test circuit 5 includes two constant current sources 6 and 7 which are connected to the cable 3 via respective switches 8 and 9. The current sources are identical and deliver identical currents I1 but are connected in opposite senses so that the currents flow in opposite directions. The switches 8 and 9 are arranged so that only one can be closed at any one time.

The junction between the two switches 8 and 9 is connected via line 10 to two sample-and-hold (S/H) circuits 11 and 12. Connection to each S/H circuit 11 and 12 is controlled by respective switches 13 and 14 which are ganged with switches 8 and 9. In this way, when switch 8 is closed, switch 13 is also closed and the S/H circuit 11 is connected to line 10. Similarly, when switch 9 is closed, switch 14 is closed and the S/H circuit 12 is connected to line 10. The outputs of the two S/H circuits 11 and 12 are connected to different inputs of a differential amplifier 15. The output of the amplifier 15 is connected to utilization means 16 which may be a visual display or audible alarm which indicates a fault in the fire extinguisher system.

In order to measure the resistance of the squib 1, one of the switches 8 is closed so that a current I1 is applied to the firing cable 3 and hence to the squib. The magnitude of the current is low so that there is no risk that the squib will fire or deteriorate. The voltage V1 on line 10, and hence at the input of the S/H circuit 11 will be:

$$V1 = I1.Rm + Ve \quad (1)$$

where Ve is the voltage at the point to which the squib 1 is grounded. The first switch 8 is then opened and the second switch 9 is closed so that the same current, but in the opposite direction is applied to the squib. This causes a voltage V2 on line 10, and hence at the input of the second S/H circuit 12 of:

$$V2 = -I1.Rm + Ve \quad (2)$$

The amplifier 15 acts to subtract the voltages stored in the two S/H circuits 11 and 12 so as to eliminate the unknown remote ground voltage Ve. This gives:

$$V1 - V2 = 2I1.Rm$$

or $Rm = (V1 - V2)/2.I1$

With knowledge of the current I1, the utilization means 16 can calculate the resistance Rm of the squib 1 and determine whether or not it is within acceptable limits. Clearly, if the squib is short circuit or open circuit this can be detected. Similarly, if there is a short circuit of the firing cable 3 to ground before the squib, this will also be indicated as a fault.

The test system is independent of the potential at the grounding point of the squib and does not require any additional wiring to the squib.

It will be appreciated that in most practical systems, there will be more than one fire extinguisher and more than one firing circuit. The test system can be multiplexed so that it is capable of being switched to check several different squibs.

Figure 2:
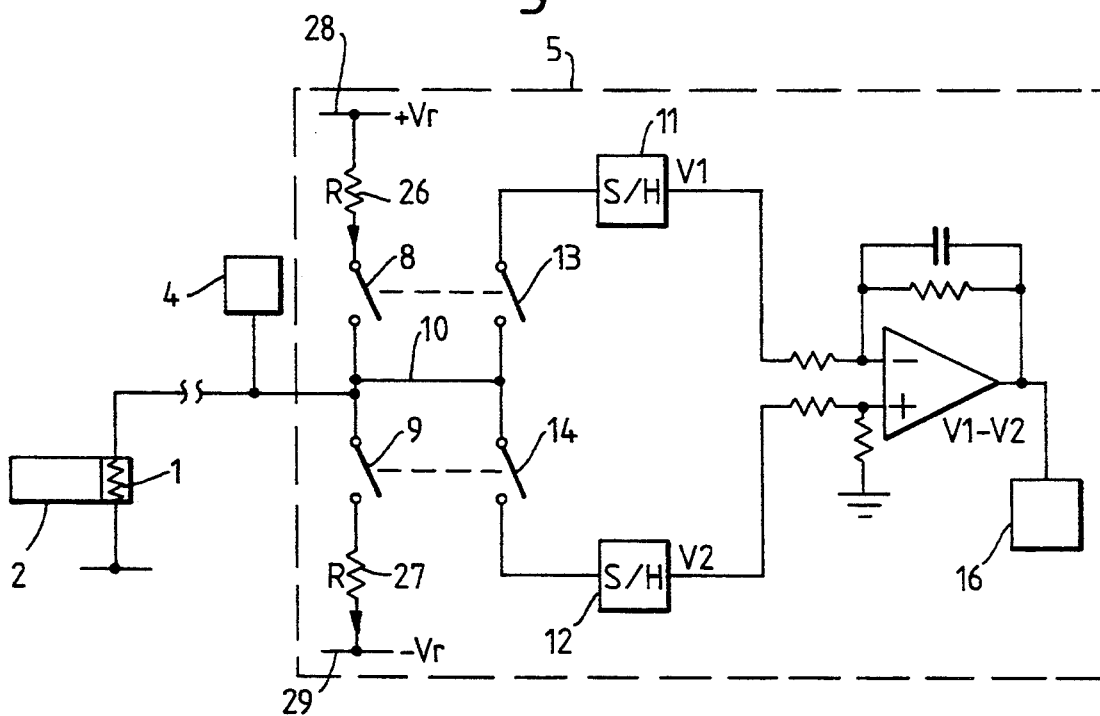
FIG. 2 is a schematic diagram of a modification to the system shown in FIG. 1.

It is not essential to use constant current sources to provide the test currents. Instead, as shown in FIG. 2 identical resistances 26 and 27 of value R could be connected between respective ones of the switches 8 and 9 and positive and negative rails 28 and 29 of voltages +Vr and -Vr respectively.

In this arrangement, when the first switch 8 is closed, the voltage at the input of the S/H circuit 11 will be:

$$V1 = ((Vr - Ve)/(R1 + Rm))Rm + Ve$$

which gives:

$$(V1 - Ve)R1 = (Vr - V1)Rm \quad (3)$$

Similarly, when the second switch 9 is closed, the voltage at the input of the other S/H circuit 12 will be:

$$V2 = ((-Vr - Ve)/(R1 + Rm))Rm + Ve.$$

which gives:

$$(V2 - Ve)R1 = (-Vr - V2)Rm \quad (4)$$

If expressions (3) and (4) are subtracted to eliminate Ve, this gives:

$$(V1 - V2)R1 = (2Vr - V1 + V2)Rm$$

or $$Rm = ((V1 - V2)/2Vr - (V1 - V2))R1$$

Thus, the utilization means 16 can calculate the resistance Rm of the squib 1 from the output of the amplifier (V1 - V2) and from knowledge of Vr and R1.

It will be appreciated that the present invention is not confined to use in testing fire extinguisher squibs but could be used in other applications such as where it is necessary to measure resistance of an element connected to ground at a remote location.

What I claim is:

1. A fire extinguisher system for an aircraft comprising: a fire extinguisher bottle located in an aircraft; a resistive explosive squib attached to said fire extinguisher bottle; means connecting one side of said squib to ground; a firing circuit; a firing cable connecting the other side of said squib to said firing circuit; and a test circuit connected to said other side of said squib via said firing cable for testing said squib and associated circuitry in the fire extinguisher system, said test circuit comprising a first current source connected via a first switch to said firing cable for supplying a first current to said squib via said firing cable in a first direction relative to ground, said first current being insufficient to cause firing of the squib, a second current source connected via a second switch to said firing cable for supplying a second current via said firing cable to said squib in a second direction relative to ground opposite from said first direction, said second current being substantially equal in magnitude to said first current and being insufficient to cause firing of the squib, said first and second switches being so arranged that only one of said switches may be closed at any given time to connect one of said current sources to said squib via said firing cable, first and second sample-and-hold circuits having inputs that are connected respectively via third and fourth switches to a junction between said first and second switches, said first and third switches being ganged together as a switch pair for simultaneous opening and closing, said second and fourth switches being ganged together as a switch pair for simultaneous opening and closing, means for alternately closing one and thereafter the other of said ganged switch pairs, a differential amplifier having a pair of inputs that are connected respectively to outputs of said first and second sample-and-hold circuits, and utilization means connected to an output of said differential amplifier for indicating the presence of a fault in said squib, in said firing cable, or in said ground connection.

2. The fire extinguisher system of claim 1 wherein each of said first and second current sources is a constant current source.

3. The fire extinguisher system of claim 1 wherein said utilization means comprises a visual display.

4. The fire extinguisher system of claim 1 wherein said utilization means comprises an audible alarm.

5. The fire extinguisher system of claim 1 wherein said utilization means is operative to calculate the resistance of said squib and determine whether said resistance is within predetermined limits.

* * * * *